United States Patent
Jeon et al.

(10) Patent No.: US 10,366,656 B2
(45) Date of Patent: Jul. 30, 2019

(54) ORGANIC LIGHT-EMITTING DIODE DISPLAY DEVICE AND METHOD OF DRIVING THE SAME

(71) Applicant: LG DISPLAY CO., LTD., Seoul (KR)

(72) Inventors: ChangHoon Jeon, Paju-si (KR); Sunghoon Rha, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 203 days.

(21) Appl. No.: 15/598,887

(22) Filed: May 18, 2017

(65) Prior Publication Data

US 2017/0337875 A1 Nov. 23, 2017

(30) Foreign Application Priority Data

May 23, 2016 (KR) .................. 10-2016-0062959

(51) Int. Cl.
*G09G 3/3258* (2016.01)
*G09G 3/3291* (2016.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
CPC .. G09G 3/3258; G09G 3/3233; G09G 3/3291; G09G 2300/0871;
(Continued)

(56) References Cited

U.S. PATENT DOCUMENTS

| 2013/0063413 A1* | 3/2013 | Miyake | ..................... G09G 3/32 345/212 |
| 2013/0069068 A1* | 3/2013 | Miyake | ................... H01L 27/06 257/59 |

(Continued)

FOREIGN PATENT DOCUMENTS

| CN | 1770247 A | 5/2006 |
| CN | 101339735 A | 1/2009 |

(Continued)

*Primary Examiner* — Rodney Amadiz
(74) *Attorney, Agent, or Firm* — Birch, Stewart, Kolasch & Birch, LLP

(57) ABSTRACT

Discussed herein are an OLED display device and a method of driving the same. The OLED display device includes according to an embodiment an organic light-emitting diode; a driving transistor involved in driving the organic light-emitting diode and including a bottom gate electrode, an oxide semiconductor layer, a source electrode, a drain electrode and a top gate electrode; a first switching transistor electrically connected to the bottom gate electrode of the driving transistor and involved in transmitting a data voltage to control the driving transistor; a storage capacitor electrically connected to the bottom gate electrode and involved in charging the data voltage; a second switching transistor configured to store a threshold voltage in the storage capacitor; a compensating transistor directly connected to the top gate electrode of the driving transistor to compensate for a deviation in the threshold voltage of the driving transistor; and a compensating capacitor disposed between the source electrode of the driving transistor and a source electrode of the compensating transistor and storing the threshold voltage therein.

20 Claims, 10 Drawing Sheets

(51) Int. Cl.
    *H01L 27/32*     (2006.01)
    *G09G 3/3233*     (2016.01)
    *H01L 27/12*     (2006.01)
    *H01L 29/786*     (2006.01)

(52) U.S. Cl.
    CPC ...... *H01L 27/1225* (2013.01); *H01L 27/1255* (2013.01); *H01L 27/3262* (2013.01); *H01L 27/3265* (2013.01); *G09G 2300/0842* (2013.01); *G09G 2300/0852* (2013.01); *G09G 2300/0861* (2013.01); *G09G 2300/0871* (2013.01); *G09G 2310/0262* (2013.01); *G09G 2310/08* (2013.01); *G09G 2320/0233* (2013.01); *G09G 2320/0257* (2013.01); *G09G 2320/043* (2013.01); *H01L 27/1214* (2013.01); *H01L 29/78648* (2013.01)

(58) Field of Classification Search
    CPC ... G09G 2300/0842; G09G 2310/0262; G09G 2310/08; G09G 2320/0233; G09G 2320/043; G09G 2320/0257; G09G 2300/0852; G09G 2300/0861; H01L 27/1255; H01L 27/1225; H01L 27/3265; H01L 27/3262; H01L 29/78648; H01L 27/1214

See application file for complete search history.

(56) References Cited

U.S. PATENT DOCUMENTS

| | | | |
|---|---|---|---|
| 2014/0168194 A1* | 6/2014 | Kong | ................... G09G 3/3233 345/212 |
| 2015/0042232 A1 | 2/2015 | Yamamoto et al. | |
| 2016/0042694 A1* | 2/2016 | Lim | ..................... G09G 3/3233 345/78 |

FOREIGN PATENT DOCUMENTS

| | | |
|---|---|---|
| CN | 102629447 A | 8/2012 |
| CN | 102820001 A | 12/2012 |
| CN | 102915703 A | 2/2013 |
| CN | 103871362 A | 6/2014 |
| CN | 104732927 A | 6/2015 |
| TW | I463467 B | 12/2014 |

* cited by examiner

ORGANIC LIGHT-EMITTING DIODE DISPLAY DEVICE AND METHOD OF DRIVING THE SAME

CROSS-REFERENCE TO RELATED APPLICATIONS

This application claims the priority of Korean Patent Application No. 10-2016-0062959 filed on May 23, 2016, in the Korean Intellectual Property Office, the disclosure of which is incorporated herein by reference.

BACKGROUND

Technical Field

The present disclosure relates to an organic light-emitting diode (OLED) display device and a method of driving the same.

Description of the Related Art

Recently, various flat panel display devices capable of reducing weight and volume to address the limitations of a cathode ray tube, have been developed. Examples of flat panel display devices include a liquid-crystal display (LCD) device, a field emission display (FED) device, a plasma display panel (PDP) device, and an organic light-emitting display (OLED) device, etc.

Among the flat panel display devices, the organic light-emitting display device displays an image using an organic light-emitting device that generates light as electrons and holes recombine, and has a fast response speed and is driven with a low power.

Typically, the OLED display devices are divided into a passive matrix OLED (PMOLED) device and an active matrix OLED (AMOLED) device depending on the manner in which the organic light-emitting diode is driven.

The AMOLED device includes a plurality of gate electrode lines, a plurality of data lines, a plurality of supply voltage lines, and a plurality of pixels connected to the lines and arranged in a matrix. Each of the pixels includes an organic light-emitting diode composed of an anode, a cathode and an organic emitting layer between the anode and the cathode, and a pixel circuit for independently driving the organic light-emitting diode. The pixel circuit mainly comprises a switching transistor for transmitting a data signal, a driving transistor for driving the EL element in response to the data signal, and a capacitor for holding the data voltage. The switching transistor charges the capacitor with the data voltage in response to a scan pulse. The driving transistor controls the amount of current supplied to the OLED according to the data voltage charged in the capacitor to adjust the amount of light emitted from the OLED.

Such an AMOLED device has advantages of low power consumption but has disadvantages in that there are deviations in characteristics such as the threshold voltage and mobility of a driving transistor for driving an organic light-emitting diode. As a result, the magnitude of the current flowing through the organic light-emitting diode changes depending on the variations in the threshold voltage, resulting in display unevenness. In addition, a voltage drop occurs in the high-potential voltage (VDD), such that the amount of current to drive the OLED is changed, thereby causing a luminance deviation between the pixels.

That is, since the characteristics of the transistors included in each pixel change depending on fabricating process parameters, it becomes difficult to fabricate the transistors of the AMOLED device so that all the transistors have the same characteristics.

In general, deviations in characteristics of the driving transistors at initial driving result in spots or mura on the screen, while deviations in characteristics of the driving transistors as they deteriorate with driving of the OLEDs result in problems that the lifetime of the OLED display panel is reduced or afterimages are created.

Recently, a compensation circuit including a plurality of transistors and capacitors has been studied in order to overcome such problems. Such a compensation circuit is additionally disposed in each of the pixels. Accordingly, a large number of transistors and capacitors are disposed in each of the pixels.

More specifically, as a compensation circuit is added in each pixel as described above, the transistors and the capacitors of each pixel as well as signal lines for controlling the transistors are added, such that the aperture ratio of the AMOLED panel is reduced. In addition, the number of components of the circuit is increased, and thus there is a disadvantage that defects are more likely to occur.

Under the circumstances, what is needed is a compensation circuit having a novel architecture that can overcome the problems resulting from deviations in the characteristics of threshold voltages of the transistors in the pixels without compromising the aperture ratio of an AMOLED panel, and an AMOLED display device including the same.

SUMMARY

In view of the above, the inventors of the application have devised a novel architecture for an OLED display device capable of compensating for deviations in the characteristics of threshold voltages of driving transistors and reducing luminance deviations among pixels, to thereby improve image quality.

An object of the present disclosure to provide a novel OLED display device in which a driving transistor with a double gate electrode structure and a top gate electrode of the driving transistor are involved in adjusting a compensation voltage for compensating deviations in the characteristics of the threshold voltage of the driving transistor, and a method of driving the OLED display device.

According to an example of the present disclosure, there is provided an organic light-emitting diode display device including an organic light-emitting element; a driving transistor involved in driving the organic light-emitting element and comprising a bottom gate electrode BG, an oxide semiconductor layer, a source electrode, a drain electrode and a top gate electrode TG; a first switching transistor electrically connected to the bottom gate electrode of the driving transistor and involved in transmitting data voltage $V_{data}$ to control the driving transistor; a storage capacitor Cst electrically connected to the bottom gate electrode and involved in charging data voltage; a second switching transistor configured to store a threshold voltage Vth in the storage capacitor; a compensating transistor directly connected to the top gate electrode of the driving transistor to compensate for a deviation in the threshold voltage of the driving transistor; and a compensating capacitor Ccomp disposed between the source electrode of the driving transistor and a source electrode of the compensating transistor and storing a threshold voltage therein.

According to another example of the present disclosure, there is provided a pixel driving circuit including a driving switching element DT having a bottom gate electrode and a top gate electrode and electrically connected to a first supply voltage line VDDL and a second supply voltage line VSSL; a first switching element ST1 for electrically connecting a data signal line DL with a first node N1 connected to the bottom gate electrode of the drive switching element DT in response to a first scan signal SCAN1; a second switching element ST2 connected to the first node and is a diode-connected transistor having its gate electrode and drain electrode commonly connected to a ground potential; a third switching element ST3 for electrically connecting a ground terminal with a second node N2 connected to the top gate electrode of the drive switching element DT in response to a second scan signal SCAN2; a first capacitor C1 electrically connected between the first node N1 and the second switching element ST2; and a second capacitor C2 electrically connected between the second node N2 and a third node N3 connected to a source electrode of the drive switching element DT.

According to yet another example of the present disclosure, there is provided an OLED display device comprising a plurality of pixels, wherein each of the pixels comprises an organic light-emitting diode and a pixel driving circuit for driving the organic light-emitting diode, wherein the pixel driving circuit comprises: a driving switching element DT having a bottom gate electrode and a top gate electrode and connected between a first supply voltage line VDDL and a second supply voltage line VSSL in series with the organic light-emitting diode; a first switching element ST1 for connecting a data signal line DL with a first node N1 connected to the bottom gate electrode of the drive switching element DT in response to a first scan signal; a second switching element ST2 connected to the first node and being a diode-connected transistor having its gate electrode and drain electrode commonly connected to a ground potential; a third switching element ST3 for connecting a ground terminal with a second node N2 connected to the top gate electrode of the drive switching element DT in response to a second scan signal; a first capacitor C1 electrically connected between the first node N1 and the second switching element ST2; and a second capacitor C2 disposed between the second node N2 and a third node N3 connected to a drain electrode of the drive switching element DT, wherein the pixel driving circuit is operated in different periods including: an initialization period in which the second and third switching elements ST2 and ST3 are turned on, such that a negative threshold voltage −Vth is applied to the first node N1 and the second node N2 is initialized to 0 V; a sampling period in which the third switching element ST3 and the driving switching element DT are turned on, such that a voltage twice the negative threshold voltage is applied to the third node N3 and a voltage twice the threshold voltage 2 Vth is stored in the second capacitor C2; a programming period in which the first switching element ST1 is turned on while the second and third switching elements ST2 and ST3 are turned off, such that data voltage $V_{data}$ is applied to the first node N1, organic light-emitting diode voltage $V_{OLED}$ is charged at the third node N3 and a voltage at the second node N2 is boosted to a voltage equal to the organic light-emitting diode voltage $V_{OLED}$ plus the voltage twice the threshold voltage 2 Vth; and an emission period in which the first and second switching elements ST1 and ST2 are turned off, such that the driving switching element DT applies a driving current to the organic light-emitting diode in response to a data signal input from the first switching element ST1.

According to an embodiment of the present disclosure, each pixel includes a driving transistor DT with a double-gate electrode structure, a compensating transistor connected to the top gate electrode of the driving transistor DT to compensate for a deviation in the threshold voltage Vth of the driving transistor DT by itself, and a compensating capacitor that stores the threshold voltage Vth between the source electrode of the driving transistor DT and the drain electrode of the compensating transistor. As a result, the threshold voltage Vth of the driving transistor DT can be held constant all the time in the compensating capacitor disposed between the one gate electrode and the source electrode of the driving transistor DT.

In addition, one electrode of the compensating capacitor is connected to the source electrode of the compensating transistor having the drain electrode connected to the ground potential, while the other electrode of the compensating capacitor is connected to the source electrode of the driving transistor. The compensating transistor becomes floating, and the source electrode of the driving transistor charges voltage as the organic light-emitting diode is turned on. As a result, the voltage at the electrode is bootstrapped to the voltage equal to the threshold voltage Vth of the driving transistor DT plus voltage of the organic light-emitting diode OLED so as to hold the threshold voltage in the compensating capacitor. Accordingly, in each pixel, the top gate electrode of the driving transistor DT is connected to the electrode of the compensating capacitor to be involved in holding the threshold voltage Vth of the driving transistor DT constant.

In this manner, it is possible to overcome or address the limitations and problems resulting from deviations in the characteristics of the threshold voltage Vth of the driving transistor DT in each pixel without compromising the aperture ratio of the AMOLED panel. According to the embodiments of the present disclosure, the threshold voltage Vth of the driving transistor DT can be efficiently compensated for, such that failure due to long driving can be prevented to thereby improve reliability, and luminance uniformity can be increased to thereby improve the lifespan.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
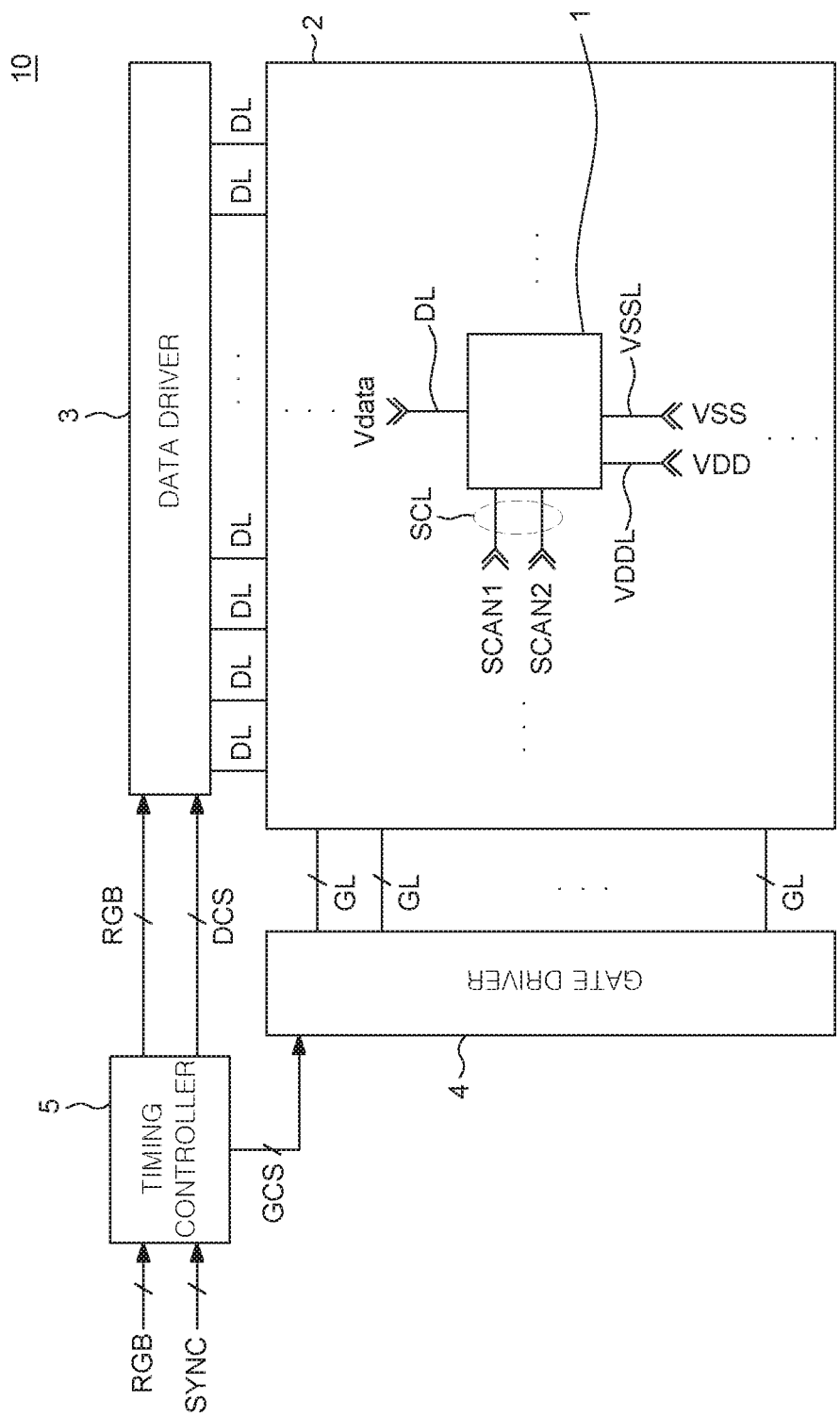
FIG. 1 is a block diagram of an organic light-emitting diode display device according to an embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting.

Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," and "the," this includes a plural of that noun unless specifically stated otherwise.

For elements having specific values, they are interpreted as including error margins even without explicit statements. In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

The exemplary embodiments of the present disclosure may be practiced with either p-type transistors or n-type transistors. In the following description, however, descriptions will be made with n-type transistors for convenience of illustration. In describing scan signals SCAN1 and SCAN2 in the form of pulses inputted to the gate electrode, the gate electrode high voltage VGH state is defined as "high state" while the gate electrode low voltage VGL state is defined as "low state."

Thus, the high voltage VGH is the gate electrode ON voltage that turns on the transistor, while the gate electrode low voltage VGL is the gate electrode OFF voltage that turns off the transistor.

Hereinafter, an organic light-emitting display device and a method of driving the same according to exemplary embodiments of the present disclosure will be described in detail with reference to the accompanying drawings.

FIG. 1 is a block diagram of an organic light-emitting diode display device according to an exemplary embodiment of the present disclosure. All components of the organic light-emitting diode display device according to all embodiments of the present disclosure are operatively coupled and configured.

An organic light-emitting diode display device 10 shown in FIG. 1 includes a display panel 2 in which a plurality of gate electrode lines GL and a plurality of data lines DL intersect each other to define a plurality of individual pixels 1, a gate driver 4 for driving the plurality of gate electrode lines GL, a data driver 3 for driving the plurality of data lines DL, a timing controller 5 for rearranging image data RGB input from an external source to supply it to the data driver 3, and for outputting a gate electrode control signal GCS and a data control signal DCS to control the gate driver 4 and the data driver 3.

According to the exemplary embodiment of the present disclosure, each pixel 1 includes an organic light-emitting diode OLED, and a pixel driving circuit that includes a driving transistor for supplying a driving current to the organic light-emitting diode OLED so as to individually drive the organic light-emitting diode OLED. In addition, the pixel driving circuit may compensate for deviations in the electric characteristic of the driving transistor such as the threshold voltage Vth and the mobility, and reduce the luminance deviation among the pixels 1 due to the difference in current supplied to the organic light-emitting diode OLED. The pixels 1 will be described later in detail with reference to FIGS. 2 to 6.

The display panel 2 has a plurality of gate electrode lines GL and a plurality of data lines DL intersecting each other. The pixels 1 are disposed at the intersections of the gate electrode lines GL and the data lines DL, respectively. Each of the pixels 1 includes an organic light-emitting diode OLED and a pixel driving circuit. Each of the pixels 1 is connected to a gate electrode line GL, a data line DL, a first supply voltage VDD line VDDL and a second supply voltage VSS line VSSL.

The gate driver 4 supplies gate electrode signals to the gate electrode lines GL in response to gate electrode control signals GCS issued from the timing controller 5. The gate electrode signals include first and second scan signals SCAN1 and SCAN2, and these signals are supplied to each of the pixels 1 via the gate electrode lines GL. The first voltage VDD is a higher potential and has a higher voltage level than the second voltage VSS which is a lower potential. The second voltage VSS may be ground potential.

The data driver 3 converts digital image data RGB input from the timing controller 5 into data voltage $V_{data}$ using a gamma reference voltage in response to the data control signals DCS issued from the timing controller 5. Then, the data driver supplies the converted data voltage $V_{data}$ to the plurality of data lines DL. In addition, the data driver 3 outputs the data voltage $V_{data}$ in a programming period t3 (see FIG. 3) of each pixel 1.

The timing controller 5 rearranges the image data RGB input from an external source taking into account the size and the resolution of the display panel 2 to supply it to the data driver 3. The timing controller 5 receives synchronization signals SYNC input from an external source, for example, a dot clock DCLK, a data enable signal DE, a horizontal synchronization signal Hsync and a vertical synchronization signal Vsync, and creates gate electrode control signals and data control signals GCS and DCS by using them. In addition, the timing controller 5 supplies the generated the gate electrode control signals GCS and the data control signals DCS to the gate driver 4 and the data driver 3, respectively, to thereby control the gate driver 4 and the data driver 3.

Figure 2:
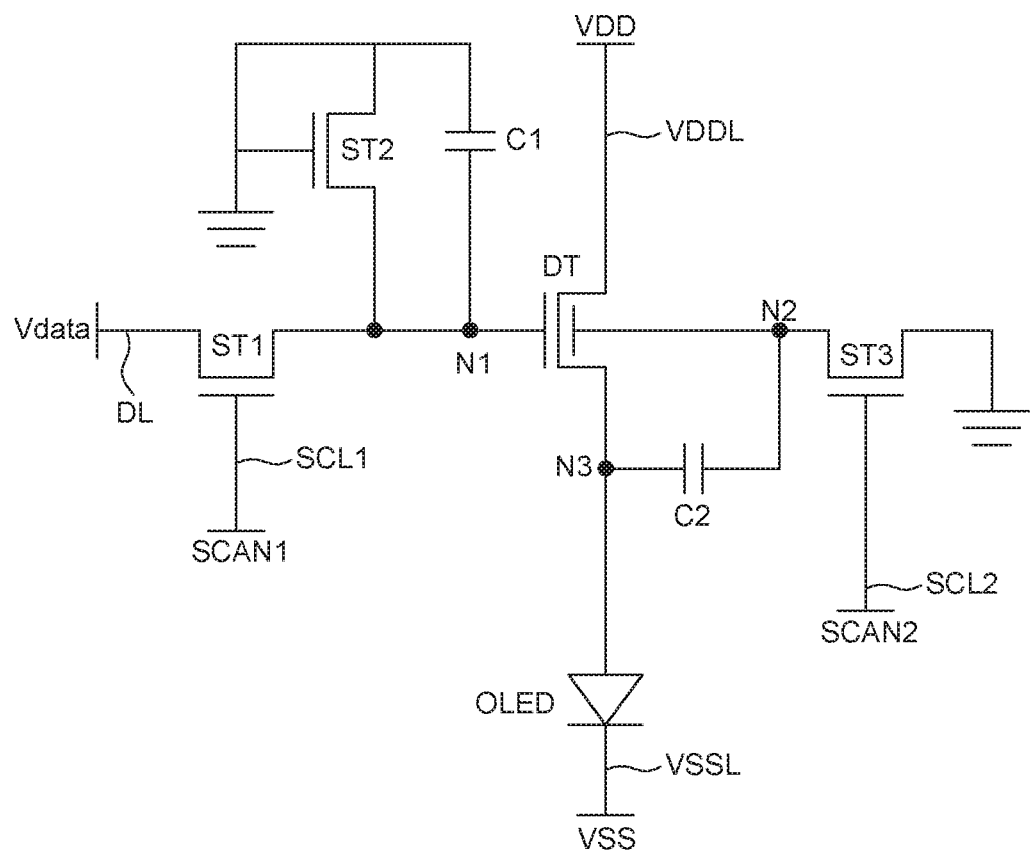
FIG. 2 is an example of a circuit diagram of the pixel shown in FIG. 1.

Hereinafter, a pixel according to an exemplary embodiment of the present disclosure will be described in detail. FIG. 2 illustrates one example of a circuit diagram of the pixel 1 shown in FIG. 1.

Referring to FIG. 2, the pixel driving circuit includes an organic light-emitting diode, four transistors and two capacitors so as to drive the organic light-emitting diode. Specifically, the pixel driving circuit includes a driving transistor DT, first to third switching transistors ST1 to ST3, and first and second capacitors C1 and C2.

The first switching transistor ST1 includes a first gate electrode, a first oxide semiconductor layer, a first source electrode, and a first drain electrode. The first source electrode of the first switching transistor ST1 is connected to a second source electrode of the second switching transistor ST2 and to a first node N1 connected to a bottom gate electrode BG of the driving transistor DT.

The first switching transistor ST1 is turned on or off according to the first scan signal SCAN1 and connects the data line DL to the first node N1 when it is turned on. That is, the data voltage $V_{data}$ provided from the data line DL is supplied to the first node N1.

The second switching transistor ST2 includes a second gate electrode, a second oxide semiconductor layer, a second source electrode and a second drain electrode. The source electrode of the second switching transistor ST2 is directly connected to the first node N1 connected to the bottom gate electrode BG of the driving transistor DT. In addition, the second switching transistor ST2 is a diode-connected transistor having the second gate electrode and the second drain electrode connected to ground potential. As a result, a negative threshold voltage (−Vth) is applied to the first node N1.

The third switching transistor ST3 includes a third gate electrode, a third oxide semiconductor layer, a third source electrode and a third drain electrode. The third drain electrode of the third switching transistor ST3 is connected to the ground potential. The third source electrode is directly connected to a second node N2 connected to a top gate electrode TG of the driving transistor DT.

The third switching transistor ST3 is turned on or off according to the second scan signal SCAN2. When the third switching transistor ST2 is turned on, the second node N2 may be connected to the ground potential, such that the voltage of the second node N2 may be 0V. When the third switching transistor ST3 is turned off, the second node N2 is floating, i.e., it does not have a fixed voltage level.

The third switching transistor ST3 may be electrically connected to the top gate electrode TG of the driving transistor DT to serve as a compensating transistor for compensating for a deviation in the threshold voltage Vth of the driving transistor DT.

The driving transistor DT is connected between the first supply voltage line VDDL and the second supply voltage line VSSL in series with the organic light-emitting diode, and supplies a driving current to the organic light-emitting diode. The first supply voltage line VDDL supplies a high-level voltage, e.g., VDD=10V or a low-level voltage, e.g., VDD=−10V to the drain electrode of the driving transistor DT as the first voltage VDD. The second supply voltage line VSSL supplies a high-level voltage, e.g., VSS=10V or a low-level voltage, e.g., VSS=−10V to the organic light-emitting diode OLED as the second voltage VSS.

The driving transistor DT includes the bottom gate electrode BG, an oxide semiconductor layer, a source electrode, a drain electrode, and the top gate electrode TG. Specifically, the driving transistor DT has a double-gate electrode structure in which the bottom gate electrode, the oxide semiconductor layer, the source electrode, the drain electrode and the top gate electrode are sequentially disposed. The bottom gate electrode BG is connected to the first node N1 to which the data voltage $V_{data}$ is supplied while the top gate electrode TG is connected to the second node N2.

The first capacitor C1 may be connected to the first node N1 and may hold the data voltage $V_{data}$ for one frame so that the driving transistor DT is turned on to allow a constant current to flow in the organic light-emitting diode. By doing so, the first capacitor C1 may be a storage capacitor (Cst) which keeps the grayscale displayed by the organic light-emitting diode constant.

One electrode of the first capacitor C1 may be connected to the first node N1 while the other electrode thereof may be connected to the ground potential in common with the second switching transistor ST2. Accordingly, a voltage of Vth is applied at the first node N1, and the first capacitor C1 may store the threshold voltage of Vth.

The second capacitor C2 is connected between the second node N2 and a third node N3 and is disposed between the source electrode of the driving transistor DT and the source electrode of the third switching transistor ST3. The second capacitor C2 may store a voltage twice the threshold voltage (2 Vth).

More specifically, a high-level supply voltage, e.g., VDD=10V is applied from the first supply voltage line VDDL to the drain electrode of the driving transistor DT as the first voltage VDD, and a high-level supply voltage, e.g., VSS=10 V is applied from the second supply voltage line VSSL to the organic light-emitting diode as the second voltage VSS. As a result, the organic light-emitting diode is turned off, and a negative voltage twice the threshold voltage (−2 Vth) is applied to the third node N3 until the driving transistor DT is turned off.

As the second capacitor C2 is connected between the second node N2 and the third node N3, the voltage of 0V is applied at the second node N2 and the voltage of −2 Vth is applied at the third node N3, such that the second capacitor C2 may store the voltage of 2 Vth. The second capacitor C2 may be a sensing capacitor used to sense the threshold voltage Vth of the driving transistor DT stored therein.

Accordingly, the threshold voltage Vth of the driving transistor DT can be controlled according to the voltage at the top gate electrode TG connected to the second node N2. By doing so, the threshold voltage Vth of the driving transistor DT of each pixel can be adjusted.

According to an exemplary embodiment of the present disclosure, the pixel driving circuit can sense the threshold voltage Vth of the driving transistor DT stored in the second capacitor C2, and the magnitude of the sensed threshold voltage Vth having a deviation can be compensated by adjusting the voltage at the top gate electrode TG.

The organic light-emitting diode display device includes the driving transistor DT that is involved in driving the organic light-emitting diode and has a double-gate electrode structure in which the bottom gate electrode, the oxide semiconductor layer, the source electrode, the drain electrode, and the top gate electrode are sequentially disposed.

In addition, the organic light-emitting diode display device includes the first capacitor C1 that is electrically connected to the bottom gate electrode and is a storage capacitor involved in charging the data voltage, and the second switching transistor ST2 that is a diode-connected transistor having the second gate electrode and the second drain electrode connected to the ground potential to thereby store the threshold voltage Vth in the storage capacitor C1.

The organic light-emitting diode display device includes the compensating transistor ST3 that is directly connected to the top gate electrode of the driving transistor DT and compensates for variations in the threshold voltage Vth of the driving transistor DT. In addition, the organic light-emitting diode display device includes the second capacitor C2 that is a compensating capacitor disposed between the source electrode of the driving transistor DT and the drain electrode of the compensating transistor ST3 to store the voltage of 2 Vth therein.

The drain electrode of the driving transistor DT is electrically connected to the first supply voltage line VDDL and the source electrode thereof is connected to the third node N3.

According to another exemplary embodiment of the present disclosure, an organic light-emitting diode display device comprises: a driving switching element DT having a bottom gate electrode and a top gate electrode and electrically connected to a first supply voltage line VDDL and a second supply voltage line VSSL; a first switching element ST1 for electrically connecting a data signal line DL with a first node N1 connected to the bottom gate electrode of the drive switching element DT in response to a first scan signal SCAN1; a second switching element ST2 connected to the first node and is a diode-connected transistor having its gate electrode and drain electrode commonly connected to a ground potential; a third switching element ST3 for electrically connecting a ground terminal with a second node N2 connected to the top gate electrode of the drive switching element DT in response to a second scan signal SCAN2; a first capacitor C1 electrically connected between the first node N1 and the second switching element ST2; and a second capacitor C2 electrically connected between the second node N2 and a third node N3 connected to a source electrode of the drive switching element DT.

The voltage between the second node N2 and the third node N3 may be held at the voltage of 2 Vth.

The organic light-emitting diode display device includes the driving transistor DT having a double-gate electrode structure, a compensating transistor connected to one gate electrode of the driving transistor DT to compensate for a deviation in the threshold voltage Vth of the driving transistor DT by itself, and a compensating transistor that stores the voltage of Vth between the source electrode of the driving transistor DT and the source electrode of the compensating transistor. As a result, the threshold voltage Vth of the driving transistor DT can be held constant all the time in the compensating capacitor disposed between the one gate electrode and the source electrode of the driving transistor DT.

In addition, one electrode of the compensating capacitor is connected to the source electrode of the compensating transistor having the drain electrode connected to the ground potential, while the other electrode of the compensating capacitor is connected to the source electrode of the driving transistor. The compensating transistor becomes floating, and the source electrode of the driving transistor charges voltage as the organic light-emitting diode is turned on. As a result, the voltage at the electrode is bootstrapped to the voltage equal to the threshold voltage Vth of the driving transistor DT plus voltage of the organic light-emitting diode OLED so as to hold the voltage of 2 Vth in the compensating capacitor.

Accordingly, the threshold voltage Vth of the driving transistor DT can be controlled according to the voltage at the top gate electrode TG connected to the second node N2. By doing so, the threshold voltage Vth of the driving transistor DT of each pixel can be adjusted.

Figure 3:
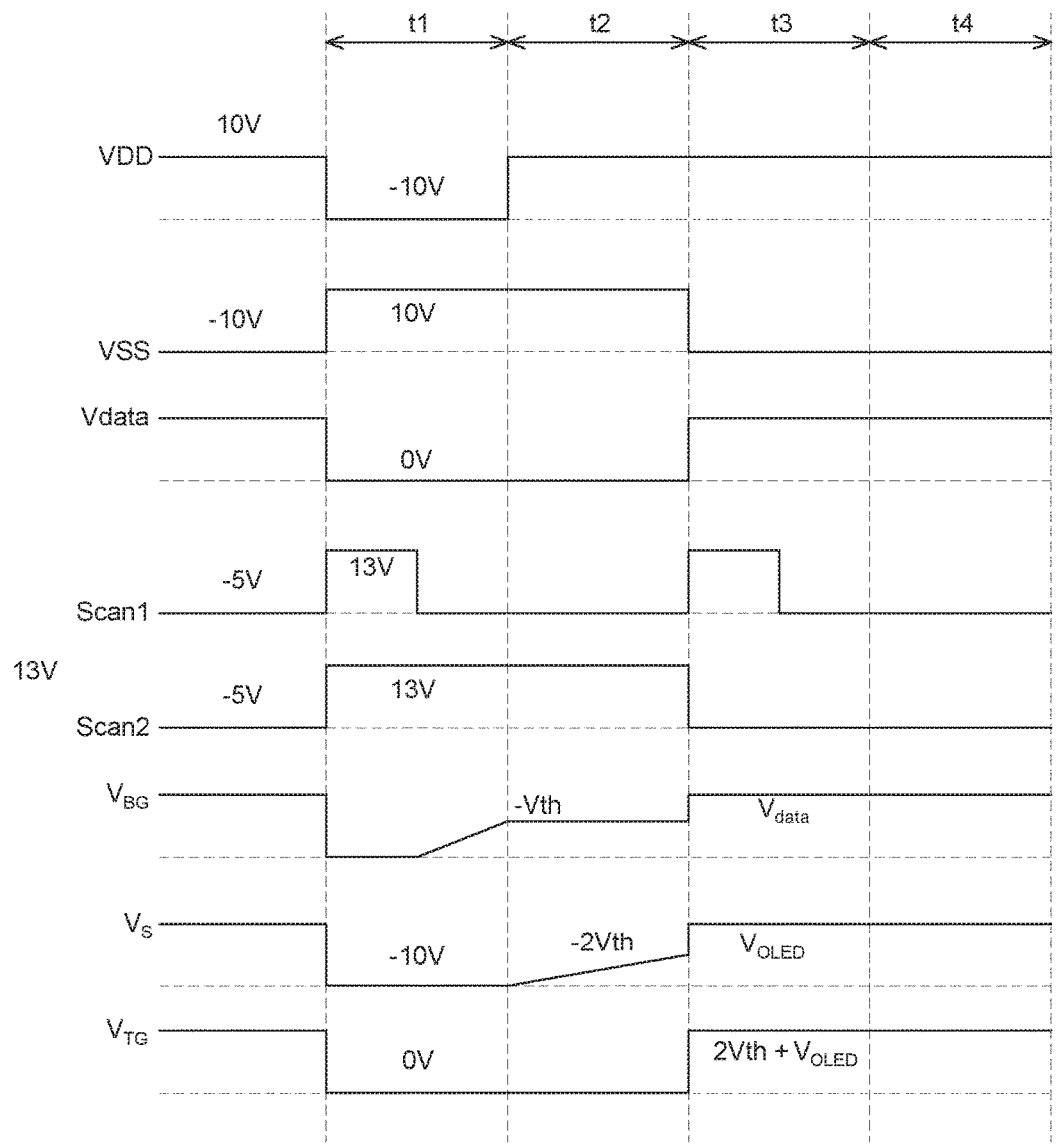
FIG. 3 is a waveform diagram illustrating an example of an operation of the pixel shown in FIG. 1 when it is driven.

FIG. 3 is a waveform diagram illustrating an example of an operation of the pixel shown in FIG. 1 when it is driven.

Referring to FIG. 3, the pixel is operated in separate periods depending on pulse timing of gate electrode signals supplied, including an initialization period t1, a sampling period t2, a programming period t3, and an emission period t4.

In the initialization period t1, the first scan signal SCAN1 starts with a high level, e.g., 13 V and is changed to a low level, e.g., −5 V to be output. The second scan signal SCAN2 is output at a high level, e.g., 13 V.

In the initialization period t1, the first voltage VDD is output at a low level, e.g., −10 V. The second voltage VSS is output at a high level, e.g., 10 V, and a voltage at a low level, e.g., −20 V is applied to an organic light-emitting diode OLED. In that initialization period t1 of each pixel P, the data driver 6 does not supply the data voltage $V_{data}$ to the data lines DL. That is, data voltage $V_{data}$ is 0 V during this period.

In the sampling period t2, the first scan signal SCAN1 is held at a low level, e.g., −5 V, and the second scan signal SCAN2 is still held at the high level, e.g., 13 V.

Also, the first voltage VDD is changed from the low level, e.g., −10 V in the initialization period t1 to a high level, e.g., 10 V to be output. The second voltage VSS is held at the high level, e.g., 10 V. The data voltage $V_{data}$ is not yet supplied from the data driver 6 through the data lines DL.

In the programming period t3, the first scan signal SCAN1 starts with a high level, e.g., 13 V and changes to a low level after a predetermined period. The second scan signal SCAN2 is changed from the high level, e.g., 13 V in the sampling period t2 to a low level, e.g., −5V to be output. The second voltage VSS is changed from the high level, e.g., 10V in the sampling period t2 to a low level, e.g., −10V to be output. During this period, the data driver 6 supplies the data voltage $V_{data}$ to the first node N1 through the data lines DL.

In the emission period t4, the organic light-emitting diode OLED output a voltage at a high level ($V_{OLED}$), and the first and second scan signals SCAN1 and SCAN2 are output at a low level e.g., −5V.

FIG. 4A to 4D are circuit diagrams showing signal flows in the periods of the waveform diagram shown in FIG. 3, respectively, according to the exemplary embodiment of the present disclosure. Hereinafter, a pixel driving circuit of an organic light-emitting diode display device according to an exemplary embodiment of the present disclosure will be described in detail with reference to FIGS. 3 to 4D.

Figure 4A:
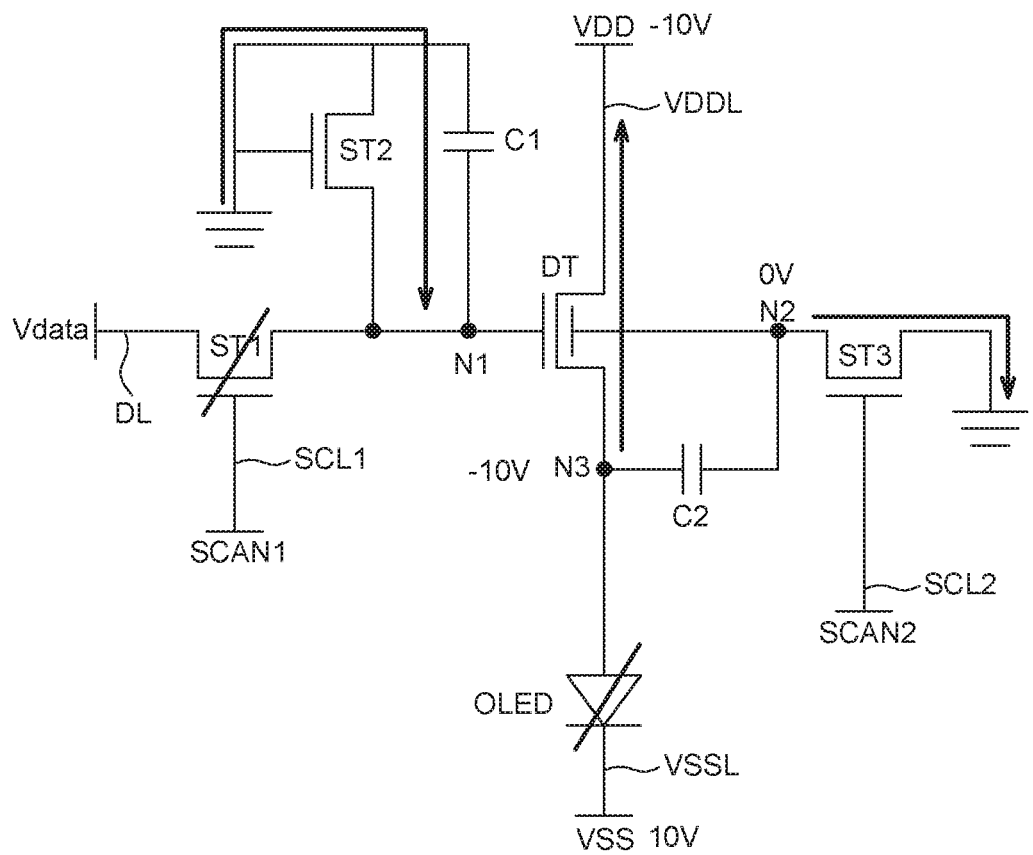
FIG. 4A to 4D are circuit diagrams showing signal flows in the periods of the waveform diagram shown in FIG. 3, respectively, according to the embodiment of the present disclosure.

Referring to FIGS. 3 and 4A, in the initialization period t1, the first scan signal SCAN1 starts with a high level, e.g., 13 V and is changed to a low level, e.g., −5 V to be output. The second scan signal SCAN2 is output at a high level, e.g., 13 V.

Referring to FIG. 4A, the first switching transistor ST1 may supply the data voltage $V_{data}$ supplied from the plurality of data lines DL to the first node N1, and the second switching transistor ST2 having its gate electrode and drain electrode commonly connected to the ground potential applies the threshold voltage of −Vth to the first node N1. In the initialization period t1, however, the data voltage $V_{data}$ is not input, such that 0V is applied at the first node N1. Also, the second node N2 is discharged so that the voltage of 0V is applied at it by the ground potential electrically connected to the third switching transistor ST3.

In addition, referring to FIG. 4A, the first capacitor C1 uses the first node N1 as one electrode and the gate electrode and the drain electrode of the second switching transistor ST2 connected to the ground potential as the other electrode. The second capacitor C2 uses the second node N2 as one electrode and the third node N3 connected to the source electrode of the driving transistor DT as the other electrode.

As a result, the first capacitor C1 is initialized to the threshold voltage (Vth) in the initialization period t1, and one electrode of the second capacitor C2 connected to the second node N2 is discharged to 0 V by the ground potential electrically connected to the third switching transistor ST3 to be initialized.

The first supply voltage VDD connected to the driving transistor DT is changed from a high level, e.g., 10 V to a low level, e.g., −10 V when the initialization period t1 starts. Then, the voltage of the low level, e.g., −10 V is applied to the third node N3 connected to the driving transistor DT. The second supply voltage VSS connected to the organic light-emitting diode is changed from a low level, e.g., −10 V to a high level, e.g., 10V. As a result, during the initialization period t1, no current flows in the organic light-emitting diode and thus it is turned off to emit no light.

Figure 4B:
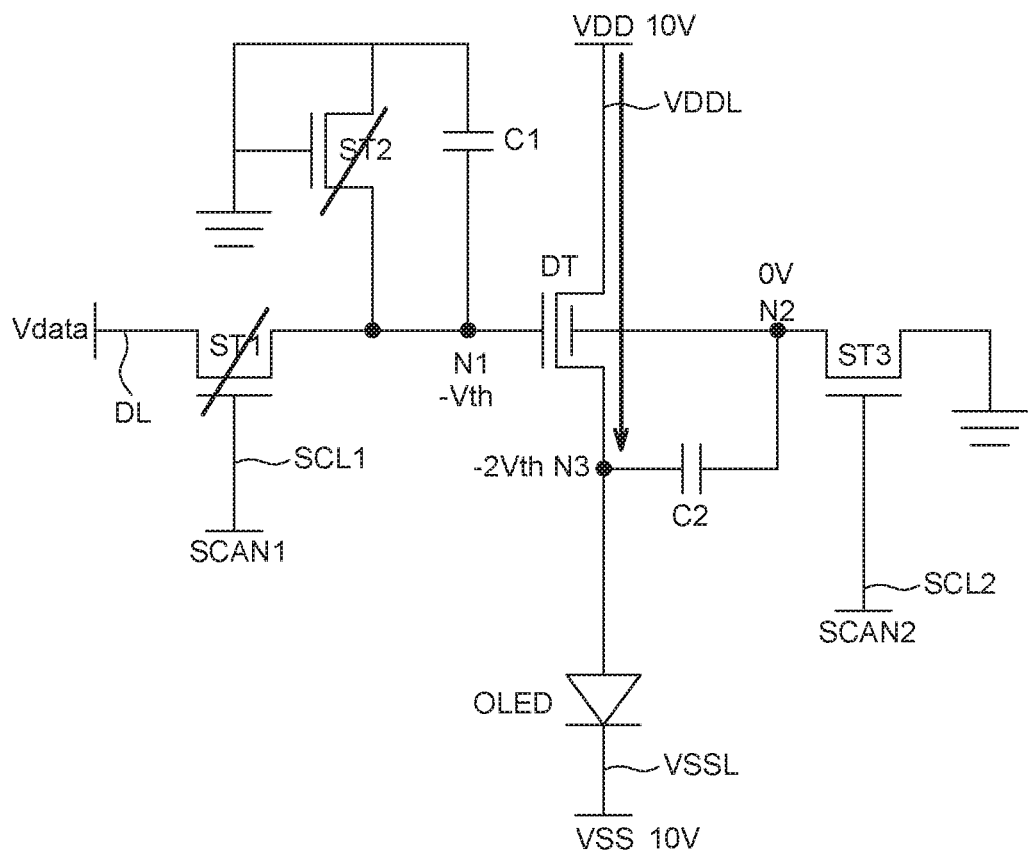

Subsequently, referring to FIGS. 3 and 4B, in the sampling period t2, the first scan signal SCAN1 remains at the low level, e.g., −5 V. The first switching transistor ST1 and the second switching transistor ST2 are being turned off. Also, the second scan signal SCAN2 is held at t high level, e.g., 13 V. The third switching transistor ST3 is being turned on. As a result, the first node N1 is held at the voltage of −Vth, and the second node N2 remains at 0V.

Further, the high-potential supply voltage VDD connected to the driving transistor DT is changed from the low level, e.g., −10 V to a high level, e.g., 10 V. Since the gate electrode-source voltage Vgs of the driving transistor DT is larger than the threshold voltage Vth, the driving transistor DT is turned on. Then, during the sampling period t2, the third node N3 is charged from a low level, e.g., −10 V to the voltage of −2 Vth. Subsequently, when the voltage at the third node N3 reaches −2 Vth, the driving transistor DT is turned off. The second node N2 is held at the voltage of 0 V, and the voltage of −2 Vth is applied at the third node N3, so that the voltage of 2 Vth is stored in the second capacitor C2. Further, the organic light-emitting diode is still turned off.

Subsequently, referring to FIGS. 3 and 4C, in the programming period t3, the first switching transistor ST1 remains turned on. Then, the data voltage $V_{data}$ supplied from the data driver 6 through the plurality of data lines DL is supplied to the first node N1 through the first switching transistor ST1, and the data voltage $V_{data}$ supplied to the first node N1 turns on the driving transistor DT. The second switching transistor ST2 is turned off.

The second supply voltage VSS connected to the organic light-emitting diode is changed from the high level, e.g., 10 V to a low level, e.g., −10V. As a result, the organic light-emitting diode is turned on, and a current path is disposed between the driving transistor DT and the organic light-emitting diode. In addition, the voltage at the third node N3 is changed from the voltage of −2 Vth to the voltage of the organic light-emitting diode $V_{OLED}$.

Figure 4C:
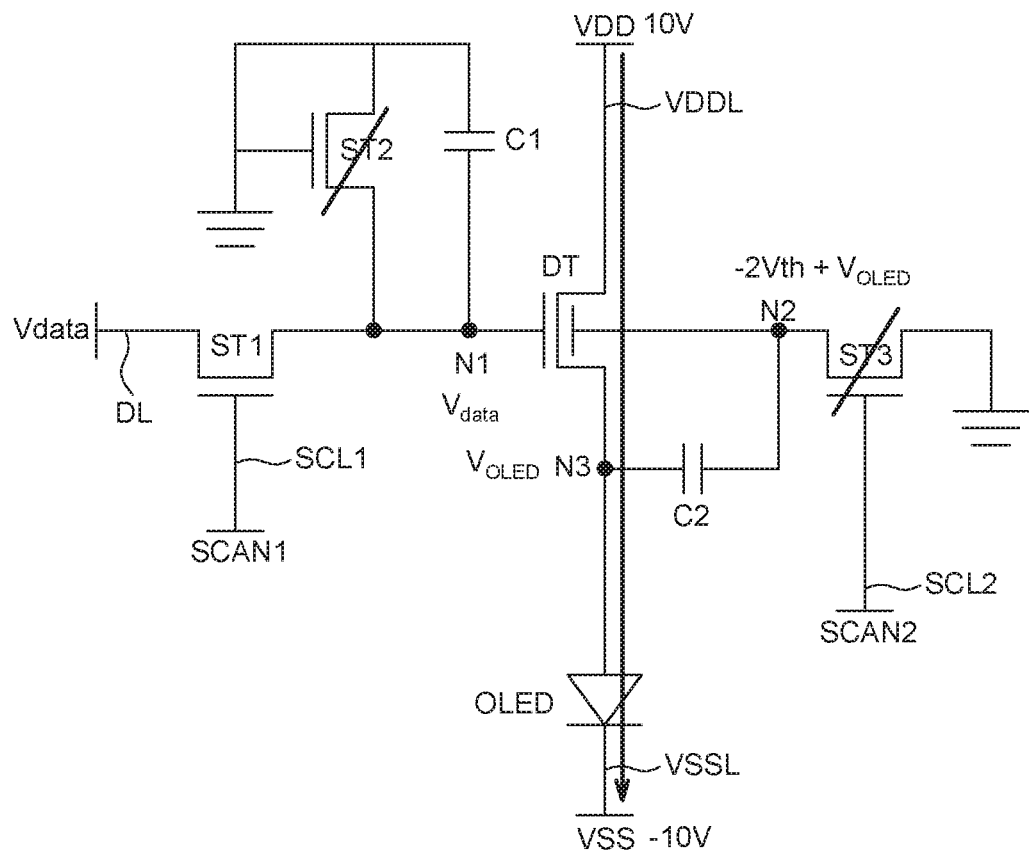
Figure 4D:
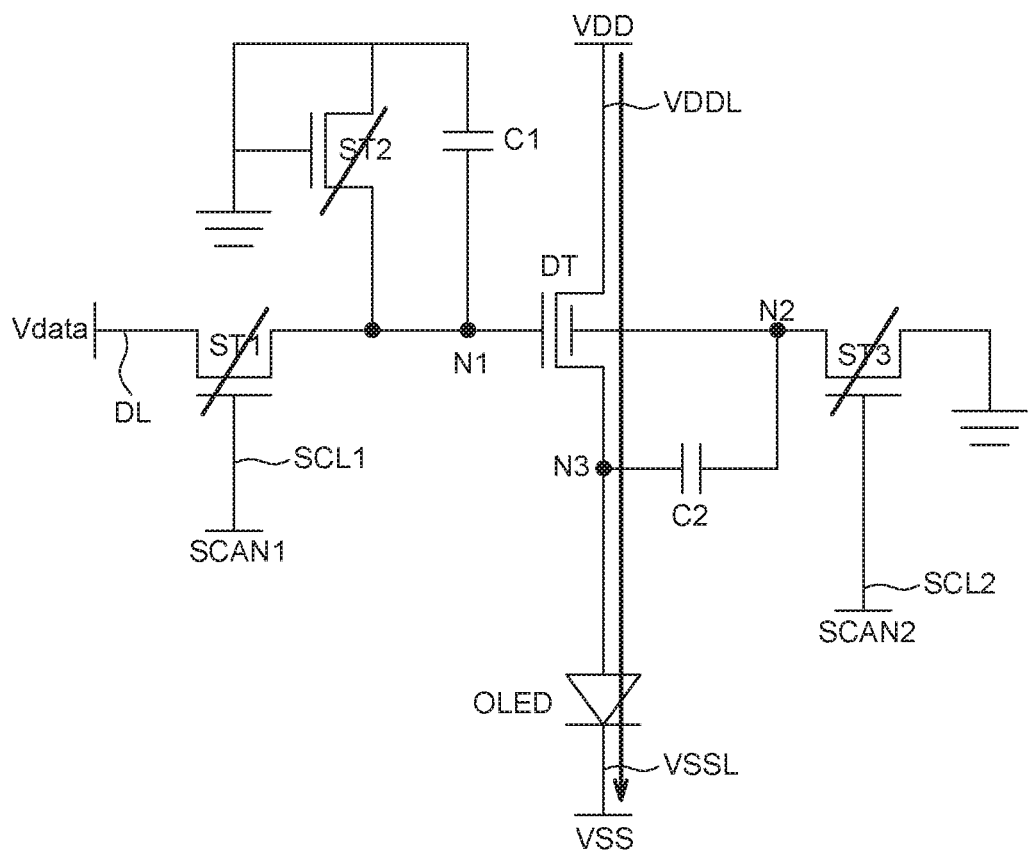

Referring to FIG. 4C, in the programming period t3, the third switching transistor ST3 is turned off. When the third switching transistor ST3 is turned off, 0 V is applied at the second node N2, such that the second node N2 is floating, i.e., it does not have a fixed voltage level.

Since one electrode of the second capacitor C2 is connected to the second node N2, in order for the second capacitor C2 to hold the voltage of 2 Vth stored in the floating state, the second node N2 connected to the electrode of the second capacitor C2 is boosted from the voltage of 0 V to the voltage of 2 Vth plus the voltage of the organic light-emitting diode OLED ($V_{OLED}$).

Accordingly, the threshold voltage Vth of the driving transistor DT can be controlled according to the voltage at the top gate electrode TG connected to the second node N2. By doing so, the threshold voltage Vth of the driving transistor DT of each pixel can be adjusted.

According to an exemplary embodiment of the present disclosure, the pixel driving circuit can sense the threshold voltage Vth of the driving transistor DT stored in the second capacitor C2, and the magnitude of the sensed threshold voltage Vth having a deviation can be compensated by adjusting the voltage at the top gate electrode TG.

For example, in the floating state, the second capacitor C2 should maintain the threshold voltage Vth at the voltage of 2 Vth, and thus the threshold voltage Vth plus the voltage of the organic light-emitting diode $V_{OLED}$ (2 Vth+$V_{OLED}$) is applied at the second node N2, while the voltage $V_{OLED}$ is applied at the third node N3. Accordingly, if the voltage twice the threshold voltage Vth of the driving transistor DT (2 Vth) is applied to the top gate electrode TG, the voltage equal to the threshold voltage Vth of the driving transistor DT is lowered in order to hold the voltage of 2 Vth at the second capacitor C2. In other words, the top gate electrode TG of the pixel driving circuit can adjust the threshold voltage Vth of the driving transistor DT more precisely. The relationship between a change in the voltage at the top gate electrode TG and the threshold voltage Vth of the driving transistor DT can be expressed by Equation 1 below:

$$\Delta V_{TH}/\Delta V_{TG} \approx -0.5 \qquad [\text{Equation 1}]$$

According to an exemplary embodiment of the present disclosure, the pixel can adjust the threshold voltages Vth of the driving transistors DT over the entire screen to be uniform. Further, during the sampling period t2, the third node N3 connected to the source electrode of the driving transistor DT is quickly charged to the voltage of −2 Vth. Then, during the programming period t3, the second node N2 uses the capacitor boosting, and thus the threshold voltage Vth of the driving transistor DT can be compensated for faster.

Subsequently, in the emission period t4, the first switching transistor ST1 is turned off. Then, the high potential voltage VDD is applied to the drain of the driving transistor DT, and the driving transistor DT supplies the driving current to the organic light-emitting diode. In this manner, the pixels P can compensate for deviations in the characteristics of the driving transistor DT, thereby reducing the luminance deviations among the pixels P.

Incidentally, the organic light-emitting diode display device according to the exemplary embodiment of the present disclosure employs a source follower topology in which a load is connected to the source electrode of the driving transistor DT instead of supplying a fixed voltage. Accordingly, even when the threshold voltage Vth of the driving transistor DT is negative, the organic light-emitting diode display device can sense the threshold voltage Vth, and thus deviations in the threshold voltage Vth can be compensated for regardless of the polarities of the threshold voltage Vth.

For an organic light-emitting diode display device in which a gate electrode and a drain electrode of a driving transistor in a pixel are connected, it is not possible to sense the threshold voltage Vth of the driving transistor DT if the threshold voltage Vth is negative. In contrast, in the organic light-emitting diode display device according to the exemplary embodiment of the present disclosure employing the source-follower topology, it is possible to sense a negative threshold voltage Vth.

In other words, in the organic light emitting diode display device according to an exemplary embodiment of the present disclosure, a change in the current flowing through the organic light-emitting diode due to deviations in a positive or negative threshold voltage (Vth) can be compensated for, such that the current according to the data voltage $V_{data}$ can be held constant regardless of the polarity as well as the threshold voltage Vth.

Figure 5A:
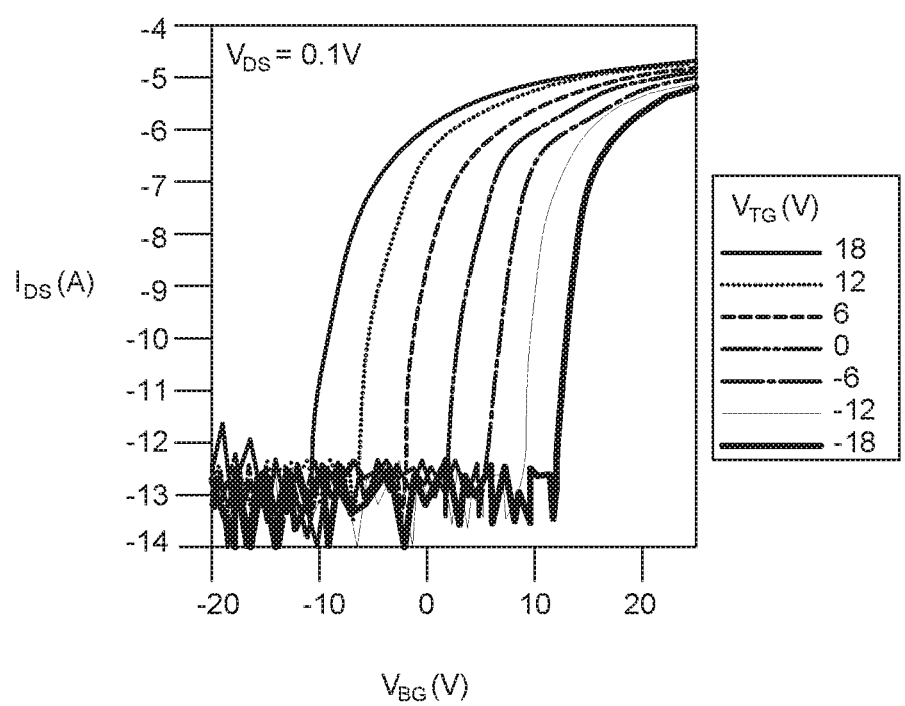
FIGS. 5A and 5B are graphs showing relationships between a voltage applied to the top gate electrode of the driving transistor shown in FIG. 2 and the threshold voltage.
Figure 5B:
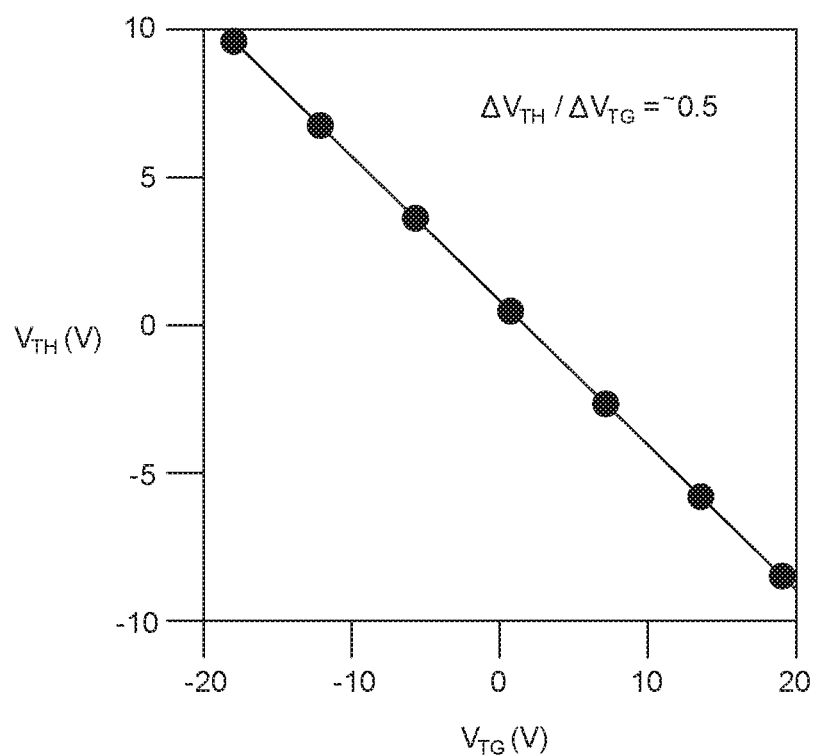

FIGS. 5A and 5B are graphs showing relationships between a voltage applied to the top gate electrode of the driving transistor shown in FIG. 2 and the threshold voltage. FIG. 5A shows electrical characteristics of a driving transistor according to an exemplary embodiment of the present disclosure. FIG. 5B is a graph showing a relationship between the voltage applied to the top gate electrode and the threshold voltage in the driving transistor.

Referring to FIGS. 5A and 5B, the electrical characteristics of the driving transistor DT change as the voltage applied to the top gate electrode TG of the driving transistor DT increases. When the voltages of −18 V, −12 V, −6 V 0 V, 6 V, 12 V and 18 V are applied to the top gate electrode TG, respectively, negative shifts occur in the threshold voltage Vth as opposed to the magnitude of the voltage applied to the top gate electrode TG. As a result, the threshold voltage Vth of the driving transistor DT can be directly compensated.

Figure 6:
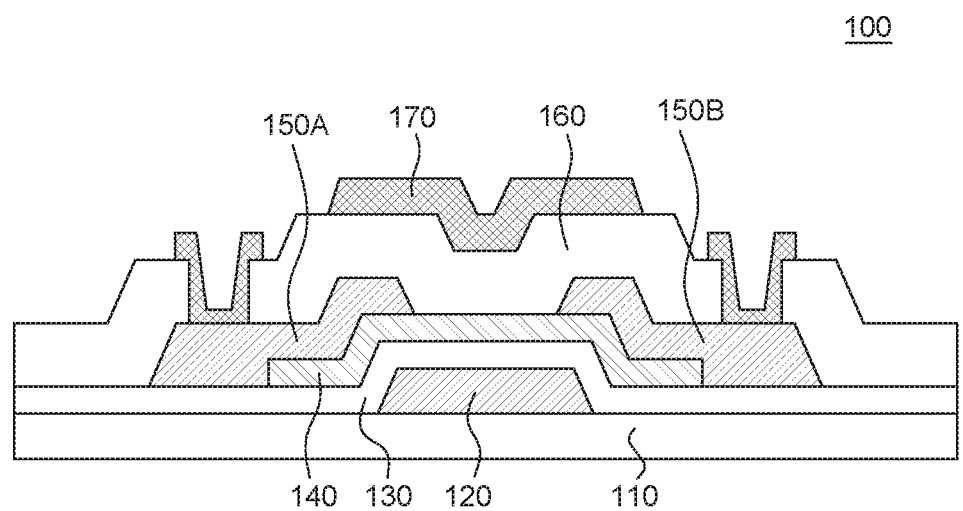
FIG. 6 is a cross-sectional view of the driving transistor according to the embodiment shown in FIG. 2.

FIG. 6 is a cross-sectional view of the driving transistor according to the exemplary embodiment shown in FIG. 2.

As shown in FIG. 6, the driving transistor DT according to the exemplary embodiment of the present disclosure includes a substrate 110, a bottom gate electrode 120, a gate insulating layer 130, an active layer 140, source and drain electrodes 150A and 150B, a passivation layer 160 and a top gate electrode 170.

Referring to FIG. 6, the driving transistor DT is a coplanar type transistor in which the source and drain electrodes 150A and 150B are located on the active layer 140 with the top gate electrode 120 disposed under the active layer 140. Specifically, the bottom gate electrode 120 is disposed on the substrate 110, and the gate insulating layer 130 is disposed between the bottom gate electrode 120 and the active layer 140. The source and drain electrodes 150A and 150B, the passivation layer 160 and the top gate electrode 170 are sequentially disposed above the active layer 140.

The gate insulating layer 130 may be made of silicon nitride (SiNx) or silicon oxide (SiOx). The thickness of the gate insulating layer 130 may be associated with the device characteristics of the driving transistor DT, especially the threshold voltage Vth control of the device. In particular, it can be said that the thickness of the gate insulating layer 130 is inversely proportional to the degree of change in the threshold voltage Vth of the driving transistor DT.

According to an exemplary embodiment of the present disclosure, the compensating capacitor C2 stores the voltage of 2 Vth to control the threshold voltage Vth of the driving transistor DT with the top gate electrode 170 of the driving transistor DT. For example, since the threshold voltage Vth of the driving transistor DT is adjusted by the voltage applied to the top gate electrode 170 of the driving transistor DT, the thickness of the gate insulating layer 130 may vary depending on the compensation value for compensating the threshold voltage Vth of the driving transistor DT to be adjusted.

Therefore, by sufficiently increasing the thickness of the gate insulating layer 130 of the driving transistor DT, it is possible to fabricate a stable driving transistor.

As described above, according to the exemplary embodiment(s) of the present disclosure, the threshold voltage Vth of the driving transistor DT can be efficiently compensated for, such that failure due to long driving can be prevented or minimized and luminance deviations among the pixels can be reduced, thereby improving the image quality.

According to an example of the present disclosure, an organic light-emitting diode display device comprises an organic light-emitting element; a driving transistor involved in driving the organic light-emitting element and comprising a bottom gate electrode BG, an oxide semiconductor layer, a source electrode, a drain electrode and a top gate electrode TG; a first switching transistor electrically connected to the bottom gate electrode of the driving transistor and involved in transmitting data voltage $V_{data}$ to control the driving transistor; a storage capacitor Cst electrically connected to the bottom gate electrode and involved in charging data voltage; a second switching transistor configured to store a threshold voltage Vth in the storage capacitor; a compensating transistor directly connected to the top gate electrode of the driving transistor to compensate for a deviation in the threshold voltage of the driving transistor; and a compensating capacitor Ccomp disposed between the source electrode of the driving transistor and a source electrode of the compensating transistor and storing a threshold voltage therein.

The thickness of the gate insulating layer may be controlled by a compensation value for compensating for the threshold voltage of the driving transistor.

The first switching transistor includes a first gate electrode, a first oxide semiconductor layer, a first source electrode, and a first drain electrode. The first source electrode may be directly connected to a first node N1 connected to the bottom gate electrode of the driving transistor.

The second switching transistor includes a second gate electrode, a second oxide semiconductor layer, a second source electrode, and a second drain electrode. The second gate electrode and the second drain electrode both may be connected to the ground potential, one electrode of the storage capacitor Cst may be connected to the ground potential.

The other electrode of the storage capacitor Cst may be connected to a first node N1 and the source electrode of the first switching transistor.

The compensating transistor may include a third gate electrode, a third oxide semiconductor layer, a third source electrode and a third drain electrode, and the third source electrode may be directly connected to a second node N2 connected to the top gate electrode of the driving transistor.

The drain electrode of the driving transistor may be electrically connected to the first supply voltage line VDDL, while the source electrode of the driving transistor may be connected to the third node N3.

When the second switching transistor and the compensating transistor are turned on, a negative threshold voltage −Vth of the second switching transistor may be applied to the first node N1, and the voltage of 0 V may be applied to the second node N2.

When the second switching transistor is turned off while the compensating transistor is turned on, the voltage twice the negative threshold voltage may be applied to the third node N3.

When the first switching transistor is turned on while the compensating transistor is turned off, the organic light-emitting diode is turned on and the voltage $V_{OLED}$ applied to the organic light-emitting diode may be applied to the third node N3.

When the compensating transistor is turned off, the second node N2 may be floating.

In order to hold the voltage twice the threshold voltage (2 Vth) stored in the compensating capacitor, the voltage at the second node may be boosted to a voltage equal to the voltage of the organic light-emitting diode ($V_{OLED}$) plus the voltage twice threshold voltage of the driving transistor.

The voltage between the second node N2 and the third node N3 is held at the voltage twice the threshold voltage, so that the voltage applied to the top gate electrode of the driving transistor can control the threshold voltage of the driving transistor.

According to an example of the present disclosure, a pixel driving circuit includes a driving switching element DT having a bottom gate electrode and a top gate electrode and electrically connected to a first supply voltage line VDDL and a second supply voltage line VSSL; a first switching element ST1 for electrically connecting a data signal line DL with a first node N1 connected to the bottom gate electrode of the drive switching element DT in response to a first scan signal SCAN1; a second switching element ST2 connected to the first node and is a diode-connected transistor having its gate electrode and drain electrode commonly connected to a ground potential; a third switching element ST3 for electrically connecting a ground terminal with a second node N2 connected to the top gate electrode of the drive switching element DT in response to a second scan signal SCAN2; a first capacitor C1 electrically connected between the first node N1 and the second switching element ST2; and a second capacitor C2 electrically connected between the second node N2 and a third node N3 connected to a source electrode of the drive switching element DT.

The first switching element ST1 includes a first gate electrode, a first oxide semiconductor layer, a first source electrode, and a first drain electrode. The first gate electrode may be connected to a first scan signal line SCL1 for supplying a first scan signal SCAN1.

The first drain electrode may be connected to a data signal line DL to receive data voltage $V_{data}$.

The third switching element ST3 includes a third gate electrode, a third oxide semiconductor layer, a third source electrode, and a third drain electrode. The third gate electrode may be connected to a second scan signal line SCL2 for supplying a second scan signal SCAN2.

The third drain electrode may be connected to the ground potential.

When the third switching element ST3 is turned off, the second node N2 may be connected to the ground potential, i.e., it may float, with no potential difference.

The second switching element ST2 includes a second gate electrode, a second oxide semiconductor layer, a second source electrode, and a second drain electrode. The second source electrode may be connected to the first node N1 and the source electrode of the first switching element ST1. The drain electrode may be connected to one electrode of the first capacitor C1.

The other electrode of the first capacitor C1 may be connected to the first node N1 and the source electrode of the first switching element ST1.

The second capacitor C2 may store the voltage twice the threshold voltage (2 Vth).

The voltage between the second node N2 and the third node N3 is held at the voltage twice the threshold voltage (2 Vth), so that the voltage applied to the top gate electrode of the driving transistor can control the threshold voltage Vth of the driving transistor.

The voltage equal to twice the threshold voltage Vth of the driving transistor DT is applied to the top gate electrode, and the threshold voltage of the driving transistor DT can be reduced to the voltage equal to the threshold voltage Vth.

According to an example of the present disclosure, an OLED display device includes a plurality of pixels, wherein each of the pixels comprises an organic light-emitting diode and a pixel driving circuit for driving the organic light-emitting diode, wherein the pixel driving circuit comprises: a driving switching element (e.g., DT) having a bottom gate electrode and a top gate electrode and connected between a first supply voltage line (e.g., VDDL) and a second supply voltage line (e.g., VSSL) in series with the organic light-emitting diode; a first switching element (e.g., ST1) for connecting a data signal line (e.g., DL) with a first node (e.g., N1) connected to the bottom gate electrode of the drive switching element (DT) in response to a first scan signal; a second switching element (e.g., ST2) connected to the first node and being a diode-connected transistor having its gate electrode and drain electrode commonly connected to a ground potential; a third switching element (e.g., ST3) for connecting a ground terminal with a second node (e.g., N2) connected to the top gate electrode of the drive switching element (DT) in response to a second scan signal; a first capacitor (e.g., C1) electrically connected between the first node (N1) and the second switching element (ST2); and a second capacitor (e.g., C2) disposed between the second node (N2) and a third node (e.g., N3) connected to a drain electrode of the drive switching element (DT), wherein the pixel driving circuit is operated in different periods including: an initialization period in which the second and third switching elements (ST2 and ST3) are turned on, such that a negative threshold voltage (e.g., −Vth) is applied to the first node (N1) and the second node (N2) is initialized to 0 V; a sampling period in which the third switching element (ST3) and the driving switching element (DT) are turned on, such that a voltage twice the negative threshold voltage is applied to the third node (N3) and a voltage twice the threshold voltage (2 Vth) is stored in the second capacitor (C2); a programming period in which the first switching element (ST1) is turned on while the second and third switching elements (ST2 and ST3) are turned off, such that data voltage (e.g., $V_{data}$) is applied to the first node (N1), organic light-emitting diode voltage ($V_{OLED}$) is charged at the third node (N3) and a voltage at the second node (N2) is boosted to a voltage equal to the organic light-emitting diode voltage ($V_{OLED}$) plus the voltage twice the threshold voltage (2 Vth); and an emission period in which the first and second switching elements (ST1 and ST2) are turned off, such that the driving switching element (DT) applies a driving current to the organic light-emitting diode in response to a data signal input from the first switching element (ST1).

In the initialization period, the second gate electrode and the second drain electrode both are connected to the ground potential to form diode-connection, and a negative threshold voltage is supplied to the first node N1, to initialize the first capacitor C1 to the threshold voltage.

In the initialization period, the second switching element ST2 is turned on, the voltage of 0 V is applied from the ground terminal to the second node N2, to discharge the second capacitor C2.

In the sampling period, the third node N3 is charged to a voltage twice the negative threshold voltage until the gate-source voltage Vgs of the drive switching element DT reaches the threshold voltage. When the voltage at the third node N3 becomes twice the negative threshold voltage, the driving switching element DT can be turned off.

In the sampling period, the second capacitor C2 is charged to a voltage twice the threshold voltage, and a high-level voltage is applied from the second supply voltage line VSSL to the organic light-emitting diode, so that the organic light-emitting diode may not emit light.

In the programming period, a low-level voltage is applied to the second supply voltage line VSSL, such that the organic light-emitting diode is turned on, and accordingly the organic light-emitting diode voltage $V_{OLED}$ may be applied to the third node N3.

In the programming period, the third switching element ST3 is turned off so that the second node becomes floating. In order to hold the voltage twice the threshold voltage in the second capacitor, the voltage at the second node may be boosted from 0 V to the voltage equal to the organic light-emitting diode voltage $V_{OLED}$ plus the voltage twice threshold voltage.

The threshold voltage of the driving switching element can be adjusted by the voltage applied to the top gate electrode.

In the sampling period, a negative threshold voltage of the driving transistor also can be sensed.

The exemplary embodiments of the present disclosure described above may be substituted, altered, and modified by those skilled in the art without departing from the scope and spirit of the present disclosure. Therefore, the present disclosure is not limited to the above-mentioned exemplary embodiments and the accompanying drawings.

The various embodiments of the present disclosure can also be described as follows.

According to an example of the present disclosure, there is provided an organic light-emitting diode display device including an organic light-emitting element; a driving transistor involved in driving the organic light-emitting element and comprising a bottom gate electrode BG, an oxide semiconductor layer, a source electrode, a drain electrode and a top gate electrode TG; a first switching transistor electrically connected to the bottom gate electrode of the driving transistor and involved in transmitting data voltage $V_{data}$ to control the driving transistor; a storage capacitor Cst electrically connected to the bottom gate electrode and involved in charging data voltage; a second switching transistor configured to store a threshold voltage Vth in the storage capacitor; a compensating transistor directly connected to the top gate electrode of the driving transistor to compensate for a deviation in the threshold voltage of the driving transistor; and a compensating capacitor Ccomp disposed between the source electrode of the driving transistor and a source electrode of the compensating transistor and storing a threshold voltage therein.

The thickness of the gate insulating layer may be controlled by a compensation value for compensating for the threshold voltage of the driving transistor.

The first switching transistor may include a first gate electrode, a first oxide semiconductor layer, a first source electrode, and a first drain electrode. The first source electrode may be directly connected to a first node N1 connected to the bottom gate electrode of the driving transistor.

The second switching transistor may include a second gate electrode, a second oxide semiconductor layer, a second source electrode, and a second drain electrode. The second gate electrode and the second drain electrode both may be connected to the ground potential, one electrode of the storage capacitor Cst may be connected to the ground potential.

The other electrode of the storage capacitor Cst may be connected to a first node N1 and the source electrode of the first switching transistor.

The compensating transistor may include a third gate electrode, a third oxide semiconductor layer, a third source electrode and a third drain electrode, and the third source electrode may be directly connected to a second node N2 connected to the top gate electrode of the driving transistor.

The drain electrode of the driving transistor may be electrically connected to the first power supply line VDDL, while the source electrode of the driving transistor may be connected to the third node N3.

When the second switching transistor and the compensating transistor are turned on, a negative threshold voltage −Vth of the second switching transistor may be applied to the first node N1, and the voltage of 0 V may be applied to the second node N2.

When the second switching transistor is turned off while the compensating transistor is turned on, the voltage twice the negative threshold voltage may be applied to the third node N3.

When the first switching transistor is turned on while the compensating transistor is turned off, the organic light-emitting element may be turned on and the voltage $V_{OLED}$ applied to the organic light emitting element may be applied to the third node N3.

When the compensating transistor is turned off, the second node N2 may be floating.

In order to hold the voltage twice the threshold voltage (2 Vth) stored in the compensating capacitor, the voltage at the second node may be boosted to a voltage equal to the voltage of the organic light-emitting diode ($V_{OLED}$) plus the voltage twice threshold voltage of the driving transistor.

The voltage between the second node N2 and the third node N3 is held at the voltage twice the threshold voltage, so that the voltage applied to the top gate electrode of the driving transistor can control the threshold voltage of the driving transistor.

According to another example of the present disclosure, a pixel driving circuit includes a driving switching element DT having a bottom gate electrode and a top gate electrode and electrically connected to a first supply voltage line VDDL and a second supply voltage line VSSL; a first switching element ST1 for electrically connecting a data signal line DL with a first node N1 connected to the bottom gate electrode of the drive switching element DT in response to a first scan signal SCAN1; a second switching element ST2 connected to the first node and is a diode-connected transistor having its gate electrode and drain electrode commonly connected to a ground potential; a third switching element ST3 for electrically connecting a ground terminal with a second node N2 connected to the top gate electrode of the drive switching element DT in response to a second scan signal SCAN2; a first capacitor C1 electrically connected between the first node N1 and the second switching element ST2; and a second capacitor C2 electrically connected between the second node N2 and a third node N3 connected to a source electrode of the drive switching element DT.

The first switching element ST1 may include a first gate electrode, a first oxide semiconductor layer, a first source electrode, and a first drain electrode. The first gate electrode may be connected to a first scan signal line SCL1 for supplying a first scan signal SCAN1.

The first drain electrode may be connected to a data signal line DL to receive data voltage $V_{data}$.

The third switching element ST3 may include a third gate electrode, a third oxide semiconductor layer, a third source electrode, and a third drain electrode. The third gate electrode may be connected to a second scan signal line SCL2 for supplying a second scan signal SCAN2.

The third drain electrode may be connected to the ground terminal.

When the third switching element ST3 is turned off, the second node N2 may be connected to the ground potential, i.e., it may float, with no potential difference.

The second switching element ST2 may include a second gate electrode, a second oxide semiconductor layer, a second source electrode, and a second drain electrode. The second source electrode may be connected to the first node N1 and the source electrode of the first switching element ST1. The drain electrode may be connected to one electrode of the first capacitor C1.

The other electrode of the first capacitor C1 may be connected to the first node N1 and the source electrode of the first switching element ST1.

The second capacitor C2 may store the voltage twice the threshold voltage (2 Vth).

The voltage between the second node N2 and the third node N3 is held at the voltage twice the threshold voltage (2 Vth), so that the voltage applied to the top gate electrode of the driving transistor can control the threshold voltage Vth of the driving transistor.

The voltage equal to twice the threshold voltage Vth of the driving transistor DT is applied to the top gate electrode, and the threshold voltage of the driving transistor DT can be reduced to the voltage equal to the threshold voltage Vth.

According to yet another example of the present disclosure, an OLED display device includes a plurality of pixels, wherein each of the pixels comprises an organic light-emitting diode and a pixel driving circuit for driving the organic light-emitting diode, wherein the pixel driving circuit comprises: a driving switching element (DT) having a bottom gate electrode and a top gate electrode and connected between a first supply voltage line (VDDL) and a second supply voltage line (VSSL) in series with the organic light-emitting diode; a first switching element (ST1) for connecting a data signal line (DL) with a first node (N1) connected to the bottom gate electrode of the drive switching element (DT) in response to a first scan signal; a second switching element (ST2) connected to the first node and being a diode-connected transistor having its gate electrode and drain electrode commonly connected to a ground potential; a third switching element (ST3) for connecting a ground terminal with a second node (N2) connected to the top gate electrode of the drive switching element (DT) in response to a second scan signal; a first capacitor (C1) electrically connected between the first node (N1) and the second switching element (ST2); and a second capacitor (C2) disposed between the second node (N2) and a third node (N3) connected to a drain electrode of the drive switching element (DT), wherein the pixel driving circuit is operated in different periods including: an initialization period in which the second and third switching elements (ST2 and ST3) are turned on, such that a negative threshold voltage (−Vth) is applied to the first node (N1) and the second node (N2) is initialized to 0 V; a sampling period in which the third switching element (ST3) and the driving switching element (DT) are turned on, such that a voltage twice the negative threshold voltage is applied to the third node (N3) and a voltage twice the threshold voltage (2 Vth) is stored in the second capacitor (C2); a programming period in which the first switching element (ST1) is turned on while the second and third switching elements (ST2 and ST3) are turned off, such that data voltage ($V_{data}$) is applied to the first node (N1), organic light-emitting diode voltage ($V_{OLED}$) is charged at the third node (N3) and a voltage at the second node (N2) is boosted to a voltage equal to the organic light-emitting diode voltage ($V_{OLED}$) plus the voltage twice the threshold voltage (2 Vth); and an emission period in which the first and second switching elements (ST1 and ST2) are turned off, such that the driving switching element (DT) applies a driving current to the organic light-emitting diode in response to a data signal input from the first switching element (ST1).

In the initialization period, the second gate electrode and the second drain electrode both may be connected to the ground potential to form diode-connection, and the negative threshold voltage (−Vth) may be supplied to the first node (N1) to initialize the first capacitor (C1) to the threshold voltage Vth.

In the initialization period, the second switching element ST2 may be turned on, the voltage of 0 V is applied from the ground terminal to the second node N2, to discharge the second capacitor C2.

In the sampling period, the third node (N3) may be charged to a voltage twice the negative threshold voltage (−Vth) until a gate-source voltage (Vgs) of the drive switching element (DT) reaches the threshold voltage (Vth), and upon the voltage at the third node (N3) reaching the twice the negative threshold voltage (−Vth), the driving switching element (DT) may be turned off.

In the sampling period, the second capacitor (C2) may be charged to a voltage twice the threshold voltage (2 Vth), and a high-level voltage may be applied from the second supply voltage line VSSL to the organic light-emitting diode, so that the organic light-emitting diode does not emit light.

In the programming period, a low-level voltage may be applied to the second supply voltage line VSSL, such that the organic light-emitting diode is turned on, and accordingly the organic light-emitting diode voltage $V_{OLED}$ may be applied to the third node N3.

In the programming period, the third switching element (ST3) may be turned off so that the second node becomes floating, and the voltage at the second node is boosted from 0 V to the voltage equal to the organic light-emitting diode voltage ($V_{OLED}$) plus the voltage twice the threshold voltage (2 Vth) so as to hold the voltage twice the threshold voltage in the second capacitor.

The threshold voltage of the driving switching element can be adjusted by the voltage applied to the top gate electrode.

In the sampling period, a negative threshold voltage of the driving transistor also can be sensed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An organic light-emitting diode display device comprising:
   an organic light-emitting diode;
   a driving transistor involved in driving the organic light-emitting diode and comprising a bottom gate electrode, an oxide semiconductor layer, a source electrode, a drain electrode and a top gate electrode;
   a first switching transistor electrically connected to the bottom gate electrode of the driving transistor and involved in transmitting a data voltage to control the driving transistor;
   a storage capacitor electrically connected to the bottom gate electrode and involved in charging the data voltage;
   a second switching transistor configured to store a threshold voltage in the storage capacitor;
   a compensating transistor directly connected to the top gate electrode of the driving transistor to compensate for a deviation in the threshold voltage of the driving transistor; and
   a compensating capacitor disposed between the source electrode of the driving transistor and a source electrode of the compensating transistor and storing the threshold voltage therein,
   wherein one electrode of the storage capacitor is connected to a ground potential in common with the second switching transistor.

2. The organic light-emitting diode display device of claim 1, wherein the driving transistor further comprises a gate insulating layer, and a thickness of the gate insulating layer is controlled by a compensation value used to compensate for the threshold voltage of the driving transistor.

3. The organic light-emitting diode display device of claim 1, wherein the first switching transistor comprises a first gate electrode, a first oxide semiconductor layer, a first source electrode, and a first drain electrode, and
   wherein the first source electrode is directly connected to a first node connected to the bottom gate electrode of the driving transistor.

4. The organic light-emitting diode display device of claim 3, wherein, upon the second switching transistor and the compensating transistor being turned on, a negative threshold voltage of the second switching transistor is applied to the first node, and a voltage of the ground potential is applied to a second node.

5. The organic light-emitting diode display device of claim 1, wherein the second switching transistor comprises a second gate electrode, a second oxide semiconductor layer, a second source electrode, and a second drain electrode,
   wherein the second gate electrode and the second drain electrode both are connected to the ground potential, and
   wherein another electrode of the storage capacitor is connected to a first node and a first source electrode of the first switching transistor.

6. The organic light-emitting diode display device of claim 1, wherein the compensating transistor comprises a third gate electrode, a third oxide semiconductor layer, a third source electrode, and a third drain electrode, and
   wherein the third source electrode is directly connected to a second node connected to the top gate electrode of the driving transistor.

7. The organic light-emitting diode display device of claim 6, wherein upon the compensating transistor being turned off, the second node is floating.

8. The organic light-emitting diode display device of claim 1, wherein the drain electrode of the driving transistor is electrically connected to a first supply voltage line, and
   wherein the source electrode of the driving transistor is connected to a third node.

9. The organic light-emitting diode display device of claim 8, wherein upon the second switching transistor being turned off while the compensating transistor being turned on, a voltage twice a negative threshold voltage is applied to the third node.

10. The organic light-emitting diode display device of claim 8, wherein upon the first switching transistor being turned on while the compensating transistor being turned off, the organic light-emitting diode is turned on and a voltage of the organic light-emitting diode is applied to the third node.

11. The organic light-emitting diode display device of claim 10, wherein a voltage of a second node is boosted to a voltage equal to the voltage of the organic light-emitting diode plus a voltage twice threshold voltage of the driving transistor, so as to hold the voltage twice the threshold voltage stored in the compensating capacitor.

12. The organic light-emitting diode display device of claim 11, wherein a voltage between the second node and the third node is held at twice the threshold voltage, so that the voltage applied to the top gate electrode of the driving transistor controls the threshold voltage of the driving transistor.

13. An organic light-emitting diode (OLED) display device comprising:
    a plurality of pixels, wherein each of the pixels comprises an organic light-emitting diode and a pixel driving circuit for driving the organic light-emitting diode,
    wherein the pixel driving circuit comprises:
       a drive switching element having a bottom gate electrode and a top gate electrode and connected between a first supply voltage line and a second supply voltage line in series with the organic light-emitting diode;
       a first switching element configured to connect a data signal line with a first node connected to the bottom gate electrode of the drive switching element in response to a first scan signal;
       a second switching element connected to the first node and being a diode-connected transistor having its gate electrode and drain electrode commonly connected to a ground potential;
       a third switching element configured to connect a ground terminal with a second node connected to the top gate electrode of the drive switching element in response to a second scan signal;
       a first capacitor electrically connected between the first node and the second switching element; and
       a second capacitor disposed between the second node and a third node connected to a drain electrode of the drive switching element,
    wherein the pixel driving circuit is operated in different periods comprising:
       an initialization period in which the second switching element and the third switching element are turned on, so that a negative threshold voltage is applied to the first node and the second node is initialized to the ground potential;
       a sampling period in which the third switching element and the driving switching element are turned on, so that a voltage twice the negative threshold voltage is applied to the third node and a voltage twice the threshold voltage is stored in the second capacitor;

a programming period in which the first switching element is turned on while the second switching element and the third switching element are turned off, so that a data voltage is applied to the first node, a voltage of the organic light-emitting diode is charged at the third node and a voltage of the second node is boosted to a voltage equal to the voltage of the organic light-emitting diode plus the voltage twice the threshold voltage; and an emission period in which the first switching element and the second switching element are turned off, so that the driving switching element applies a driving current to the organic light-emitting diode in response to a data signal from the first switching element, and wherein the threshold voltage of the driving switching element is adjusted by a voltage applied to the top gate electrode.

14. The OLED display device of claim 13, wherein in the initialization period, both the gate electrode and the drain electrode of the second switching element are connected to the ground potential to form a diode-connection, and wherein the negative threshold voltage is applied to the first node to initialize the first capacitor to the threshold voltage.

15. The OLED display device of claim 13, wherein in the initialization period, the second switching element is turned on, and a voltage of the ground potential is applied from the ground terminal to the second node, to discharge the second capacitor.

16. The OLED display device of claim 13, wherein in the sampling period, the third node is charged to a voltage twice the negative threshold voltage until a gate-source voltage of the drive switching element reaches the threshold voltage, and wherein upon the voltage at the third node reaching the twice the negative threshold voltage, the driving switching element is turned off.

17. The OLED display device of claim 13, wherein in the sampling period, the second capacitor is charged to the voltage twice the threshold voltage, and wherein a high-level voltage is applied from the second supply voltage line to the organic light-emitting diode, so that the organic light-emitting diode does not emit light.

18. The OLED display device of claim 13, wherein in the programming period, a low-level voltage is applied to the second supply voltage line so that the organic light-emitting diode is turned on, and the voltage of the organic light-emitting diode is applied to the third node.

19. The OLED display device of claim 13, wherein in the programming period, the third switching element is turned off so that the second node is floating, and wherein the voltage at the second node is boosted from a voltage of the ground potential to the voltage equal to the voltage of the organic light-emitting diode voltage plus the voltage twice the threshold voltage, so as to hold the voltage twice the threshold voltage in the second capacitor.

20. The OLED display device of claim 13, wherein in the sampling period, a negative threshold voltage of the driving switching element is sensed.

* * * * *